United States Patent [19]

Fujiwara et al.

[11] Patent Number: 5,757,235
[45] Date of Patent: May 26, 1998

[54] METAL SEMICONDUCTOR FIELD EFFECT TRANSISTOR OF SOURCE-GROUND TYPE

[75] Inventors: Ikuo Fujiwara, Yokohama; Masami Nagaoka, Ebina; Kenji Ishida, Yokohama, all of Japan

[73] Assignee: Kabushiki Kaisha Toshiba, Kawasaki, Japan

[21] Appl. No.: 618,896

[22] Filed: Mar. 20, 1996

[30] Foreign Application Priority Data

Mar. 22, 1995 [JP] Japan .................................. 7-062488
Mar. 13, 1996 [JP] Japan .................................. 8-056037

[51] Int. Cl.$^6$ .................................................. H03C 3/193
[52] U.S. Cl. .................................. 330/277; 330/296
[58] Field of Search .............................. 330/277, 296, 330/297

[56] References Cited

U.S. PATENT DOCUMENTS 5,374,899  12/1994  Griffiths et al. .................... 330/277

OTHER PUBLICATIONS

Masami Nagaoka, et al., "Refractory WN$_x$/W Self–Aligned Gate GaAs Power Metal–Semiconductor Field–Effect Transistor for 1.9–GHz Digital Mobile Communication System Operating with a Single Low–Voltage Supply", Jpn. J. Appl. Phys., vol. 33 (pp. 767–770), Jan. 1994.

Yoshikazu Murakami, et al., "GaAs JFET MMIC Chip Set for L–Band Personal Communication Systems", 1994 Asia Pacific Microwave Conference, WS5-1, (pp. 121–126), Dec. 6, 1994.

Primary Examiner—James B. Mullins
Attorney, Agent, or Firm—Oblon, Spivak, McClelland, Maier & Neustadt, P.C.

[57] ABSTRACT

There is provided a semiconductor amplifier including a metal-semiconductor field-effect transistor (MESFET) of a source-ground type, having a threshold voltage of a predetermined value within a range of −0.5V to 0V (more preferably, −0.4V to −0.04V), and driving by a single power supply without applying a bias on a gate of the MESFET. According to the above semiconductor amplifier, very high efficiency can be realized while maintaining a sufficiently high output power.

5 Claims, 3 Drawing Sheets

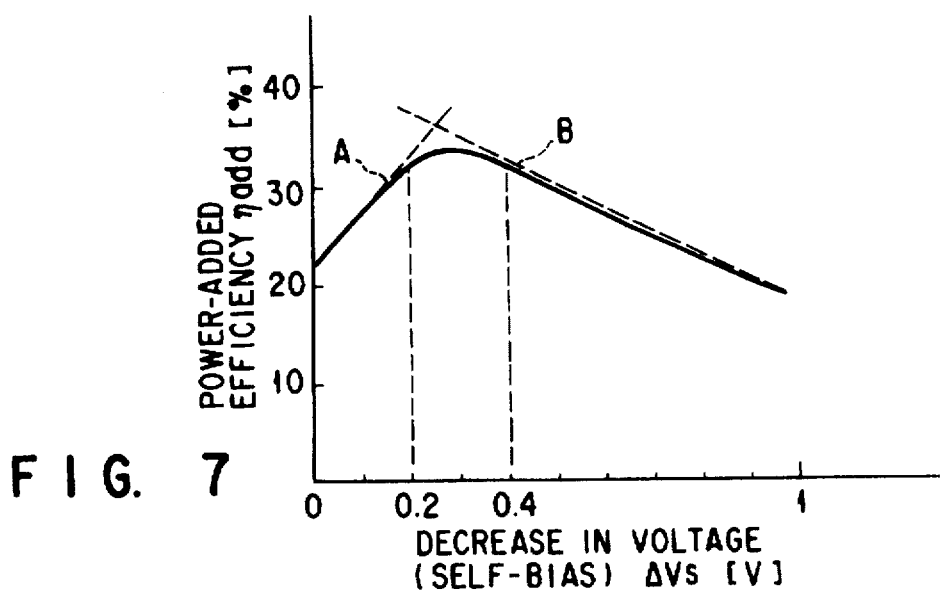
F I G. 7
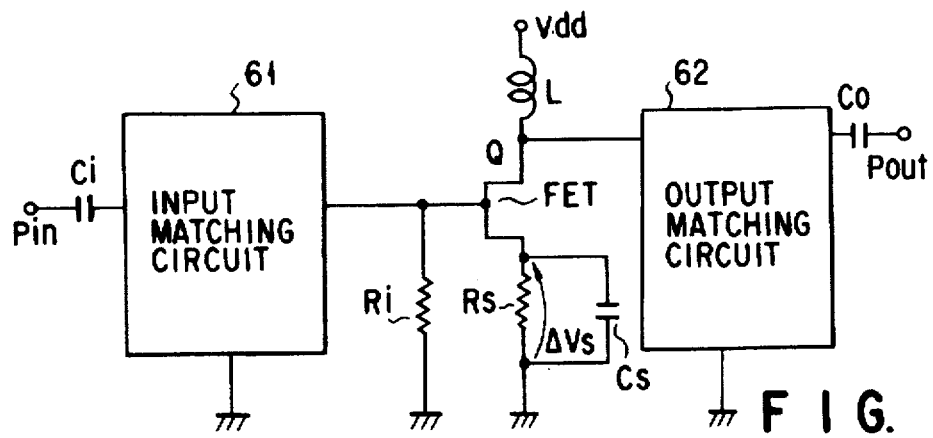
F I G. 8
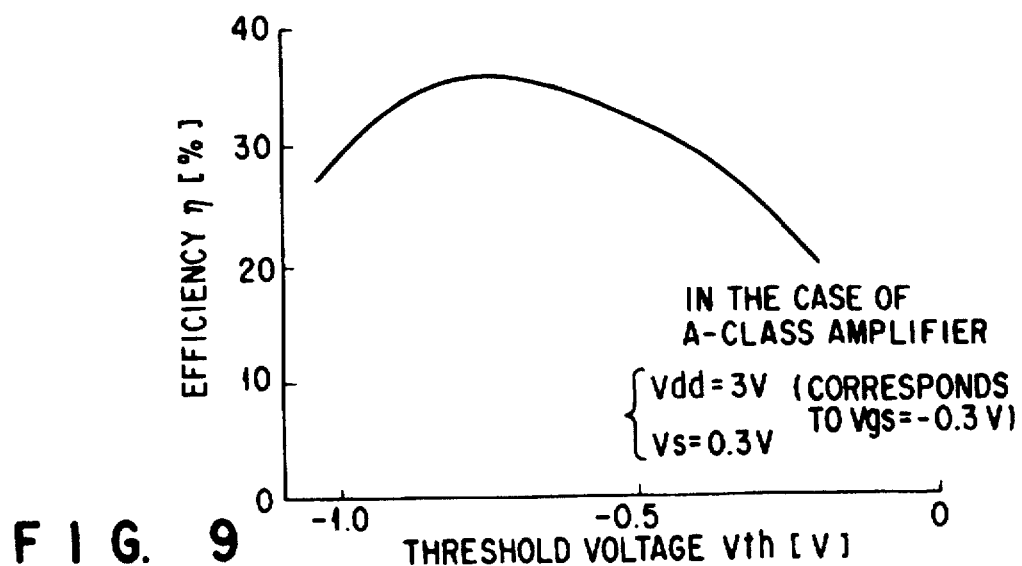
F I G. 9

METAL SEMICONDUCTOR FIELD EFFECT TRANSISTOR OF SOURCE-GROUND TYPE

BACKGROUND OF THE INVENTION

1. Field of the Invention

The present invention relates to a semiconductor amplifier which employs a source ground type MESFET (metal semiconductor field effect transistor) as an amplifying element, and more specifically, to a semiconductor amplifier in which the MESFET is driven by a single power supply.

2. Description of the Related Art

Recently, there is an increasing demand of a high-frequency semiconductor amplifier which can be operated at a low voltage in accordance with a decrease in size, a digitalization and a shifting to a quasi-micro band, in the field of the mobile telephone. In a semiconductor amplifier of the above-mentioned type, a compound semiconductor such as GaAs MESFET is generally and widely used as an amplifier element in order to deal with a high-frequency amplification.

In many cases, a general GaAs MESFET is designed as a power amplifier driven by a double power supply, in which a positive bias is applied to the drain and a negative bias is applied to the gate. However, the system of the general GaAs MESFET entails drawbacks such as an increase in the number of elements due to the negative voltage supply circuit or the like, or the complication of the circuit structure. For this reason, there rises a great demand of development of a power amplifier constituted to be capable of driving the MESFET by a single power supply, without applying a bias to the gate of the GaAs MESFET.

Further, in the case where a phase modulation wave such as π/4-shifted QPSK (quadrature phase shift keying) signal is used as an input signal, the linearity of the amplifying element is important. Therefore, it is considered that such an amplification element entails class A and class AB operations.

Under the above-described circumstances, a power amplifier which employs a source-ground type MESFET carries out a class A operation driven by a single power at a gate bias of 0V, has been made publish as a power amplifier (Jpn.J.Appl.Phys.Vol.33(1994) pages 767 to 770).

However, the power amplifier of the above type carries out a class-A operation at a gate bias of 0V, and therefore the threshold voltage is set large in a negative side, such as −0.5V to −0.6V. Consequently, the consumption current becomes large, while being able to maintain a sufficient output power. AS a result, a high efficiency cannot be obtained.

As described above, in the conventional semiconductor amplifier which employs a GaAs MESFET or the like, the dissipation is increased when the MESFET is driven by a single power supply. Consequently, it is conventionally difficult to maintain the low power dissipation and the efficiency at a high level.

SUMMARY OF THE INVENTION

The object of the present invention is to provide a semiconductor amplifier, in which the MESFET is driven by a single power supply, a sufficient output power can be obtained and a higher efficiency can be achieved.

According to the first aspect of the present invention, there is provided a semiconductor amplifier comprising: a source-ground type metal-semiconductor field-effect transistor (MESFET), a threshold voltage of which is set at a predetermined value within a range of −0.5V to 0V (preferably, a predetermined value within a range of −0.4V to −0.04); and a circuit for driving the MESFET by a single power supply, without applying a bias on a gate of the MESFET.

According to the second aspect of the present invention, there is provided a semiconductor amplifier comprising: a source-ground type metal-semiconductor field-effect transistor (MESFET); a circuit for driving the MESFET by a single power supply; and a self-bias generating circuit for generating a bias voltage between a gate and a source of the MESFET by utilizing a voltage drop between the source of the MESFET and a ground; wherein a difference between a threshold voltage of the MESFET and the bias voltage takes a predetermined value within a range of −0.7V to −0.2V.

It is preferable in connection with the semiconductor amplifier having the above-described structure, that the threshold value of the MESFET should be set at a predetermined value within a range of −1V to 0.5V. Further, it is possible that the amplifier has a structure in which the self-bias generating circuit generates a bias voltage having a predetermined value within a range of 0.2V to 0.4V. The MESFET should preferably include a compound semiconductor, GaAs. The self-bias generating circuit may include a passive element inserted between the source of the MESFET and the ground.

Additional objects and advantages of the present invention will be set forth in the description which follows, and in part will be obvious from the description, or may be learned by practice of the present invention. The objects and advantages of the present invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the present invention and, together with the general description given above and the detailed description of the preferred embodiments given below, serve to explain the principles of the present invention in which:

FIG. 2 is a graph designed to explain the basic idea of the present invention practiced in the first embodiment, which illustrates the dispersion ΔVth of the threshold voltage Vth caused by a variation of the processing condition and the like;

Vgs) between the threshold voltage and the bias voltage of the MESFET, and a power-added efficiency ηadd in the case where the source-ground type MESFET is driven by a single power supply;

FIG. 7 is a graph designed to explain the basic idea of the present invention practiced in the second embodiment, which illustrates the relationship between the self-bias (voltage drop) ΔVs and the power-added efficiency ηadd of the source-ground type MESFET;

FIG. 8 is a diagram showing the circuit structure of a linear power amplifier according to the second embodiment; and FIG. 9 is a graph illustrating the relationship between the threshold voltage Vth and the efficiency n in the second embodiment.

DETAILED DESCRIPTION OF THE PREFERRED EMBODIMENTS

Embodiments of the present invention will now be described with reference to accompanying drawings.

(First Embodiment)

Before describing a specific example of the first embodiment, the basic idea of the present invention practiced in the first embodiment will now be described.

The semiconductor amplifier of the present invention is of a high-frequency type which is operated at a low voltage. In this semiconductor amplifier, a source-ground type MESFET which operates as an amplifying element is provided. The MESFET is constituted such that it can be driven by a single power supply while the gate bias being set at 0V. In this case, the threshold voltage of the MESFET is set within a range of −0.5V to 0V (preferably −0.4V to −0.04V). The reason why the threshold voltage should preferably be set within the above range, will be made clear from the following description.

Figure 1:
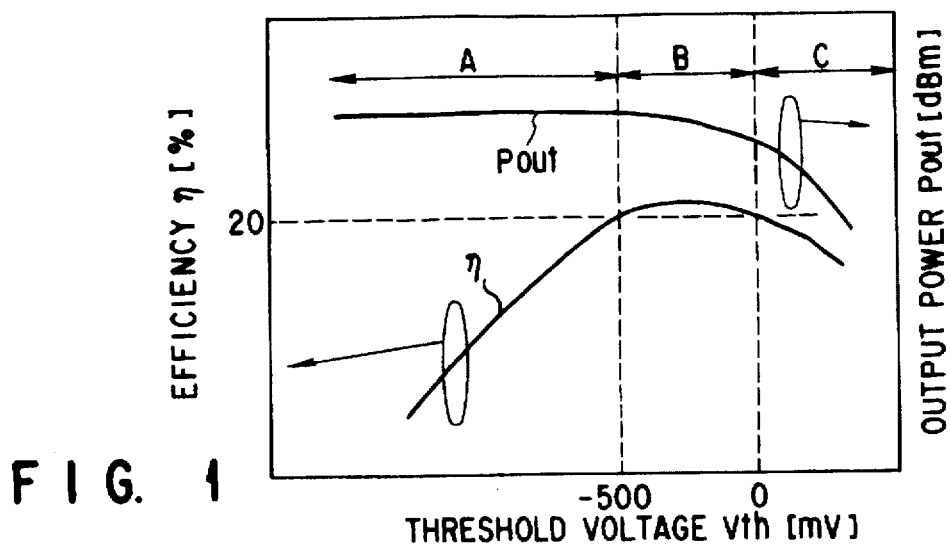
FIG. 1 is a graph designed to explain a basic idea of the present invention practiced in the first embodiment, which illustrates the relationship between a threshold voltage Vth and each of an efficiency η and an output power Pout in the case where the MESFET is driven by a single power supply without applying a bias on the gate of the source-ground type MESFET.

In the case where the source-drain type MESFET is operated by a single power supply at a gate bias of 0V, the threshold voltage dependence of each of the output characteristics can be generally illustrated as shown in the graph of FIG. 1. It should be noted that the threshold value is defined as a gate voltage obtained when the depletion layer created by a gate bias, reaches the lower end of the operation layer, so as to block a carrier which moves within the operation layer.

In practice, in a graph whose horizontal axis indicates a gate bias when a bias is applied to the drain in a saturated current region and whose vertical axis indicates the square root of a drain current, the threshold voltage is defined as a gate bias value at a cross point between an extrapolation line and the horizontal axis within a linear region of the graph. A threshold value obtained from this graph is equivalent to that of the threshold value obtained by the above definition.

First, the output power will be described. As can be seen in FIG. 1, in a region B, the output voltage amplitude becomes larger as the threshold voltage Vth moves in the negative direction. However, when the threshold value voltage Vth moves in the negative direction down to a certain point, the output voltage amplitude is limited by a Schottky barrier potential which dominates the forward-directional gate breakdown voltage. Consequently, the output power Pout is saturated in the area A. In contrast, as the threshold voltage Vth increases in the positive direction, the amplitude of the output voltage becomes smaller and the operation area increasingly overlaps the non-linear region situated close to the threshold voltage Vth. As a result, the output power Pout is easily distorted, and the reduction of the output power Pout is rendered more prominent in the region C.

Next, the consumption current will now be described. As can be seen in FIG. 1, as the threshold voltage Vth moves in the positive direction, the consumption current is decreased region A. Consequently, the efficiency η is increased because the output power Pout is saturated. However, when the threshold voltage Vth is directed in the positive direction to a certain degree, an effect due to the decrease in the output power Pout and an effect due to the decrease in the consumption current counteract each other. Therefore, the increase in the efficiency η in the region B is stopped. As the threshold voltage Vth moves in the positive direction, the decrease in the output power Pout becomes prominent. Consequently, the efficiency η starts to decrease in the region C.

As described, the efficiency η exhibits the characteristics having a convex shape with regard to the threshold voltage Vth, and the convex portion has a saturation area B within a certain range. In the case of a GaAs MESFET, the saturation area B is within a range of about −0.5V to 0V regardless of the symmetry or asymmetry of the ion implantation region, the self-alignment, or the structure of the recess or the like. Within this range, an efficiency η of 20% or higher can be obtained at a maximum of 23%, which is remarkably high value as compared to the conventional example of the source-ground type MESFET. Further, the output power Pout is sufficient although the value thereof is slightly lower than that of the conventional example.

Figure 2:
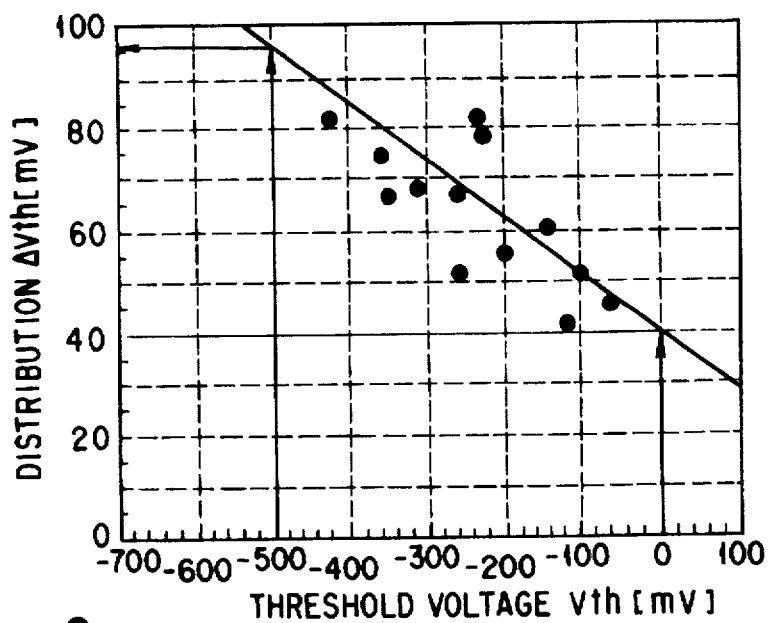

It should be noted that the threshold voltage Vth may vary among a plurality of transistors, depending on a processing condition. The present inventors examined the distribution ΔVth of the threshold voltage Vth, and obtained the results as shown in FIG. 2, that is, the distribution ΔVth at Vth=−0.5V was about 95 mV, and the distribution ΔVth at Vth=0V was 0.04V. In order to hold the distribution ΔVth within a range of the saturation region B at all times, despite of such a distribution ΔVth, the threshold voltage Vth should be set within a range of −0.405V to −0.04V.

Next, a specific example of the semiconductor amplifier according to the first embodiment will now be described.

Figure 3:
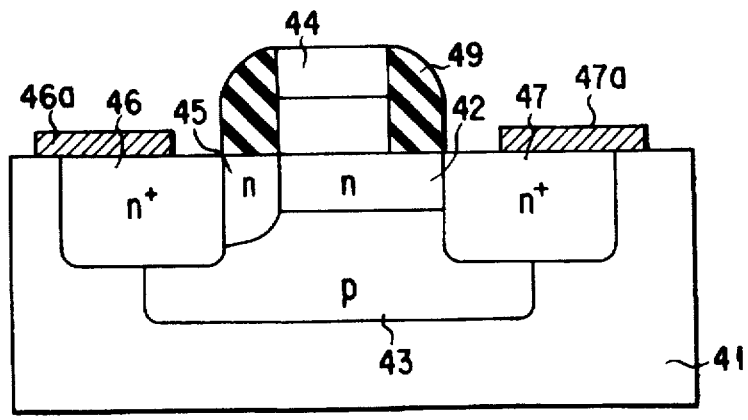
FIG. 3 is a cross sectional view showing the element structure of a GaAs power MESFET according to the first embodiment.

FIG. 3 is a cross sectional view showing the element structure of a GaAs power MESFET which constitutes the semiconductor amplifier according to the first embodiment of the present invention. A substrate 41 is of a semi-insulating GaAs type. An n-type layer 42 serving as an active layer is formed on a surface of this substrate 41, and a buried p-type layer 43 is formed underneath the n-type layer 42 by an ion implantation method. In order to manufacture a plurality of types of GaAs power MESFETs which have threshold voltages Vth different from each other, a plurality of substrates 41 are prepared, and different amounts of Si are injected to the n-type layer 42 of each of the substrates 41.

Next, a refractory accumulation layer gate 44 made of a WNx/W material is formed, and then an ion implantation is carried out using this gate as a mask. Thus, a source-side medium concentration layer 45 is formed. Subsequently, a side-wall insulation film 49 is formed by the deposition of an insulation film, followed by etch-back. Then, using this insulation film 49, an ion implantation is carried out, thus forming source-drain diffusion layers 46 and 47 by self-alignment. After that, a source electrode 46a is formed on the source diffusion layer 46, and a drain electrode 47a is formed on the drain diffusion layer 47.

Regarding the MESFET according to the first embodiment, an asymmetric structure in which a medium concentration layer is not formed on the drain side, is employed for the improvement of the breakdown voltage.

The ion implantation conditions for each layer are set as follows. Mg is implanted as a p-type impurity into the buried p-type layer 43. The implantation energy and the dose amount are set as 180 keV and $2.0 \times 10^{12} \text{cm}^{-2}$, respectively. Si is implanted as an n-type impurity to the medium concentration layer 45 and the source-drain diffusion layers 46 and 47. The implantation energy and the dose amount for these layers are 110 keV and $1.3 \times 10^{13} \text{cm}^{-2}$, and 135 keV and $6.0 \times 10^{13} \text{cm}^{-2}$, respectively.

Si is implanted as an n-type impurity into the active layer 42, and the implantation energy is set at 25 keV. However, the dose amount varies in accordance with a desired threshold voltage Vth. In the first embodiment, the dose amount is set in a range of $1.0 \times 10^{13} \text{cm}^{-2}$ to $2.7 \times 10^{13} \text{cm}^{-2}$. For example, in the case where Vth=−0.5 to 0V, the dose amount is set in a range of $9.1 \times 10^{12} \text{cm}^{-2}$ to $6.5 \times 10^{12} \text{cm}^{-2}$.

Figure 4:
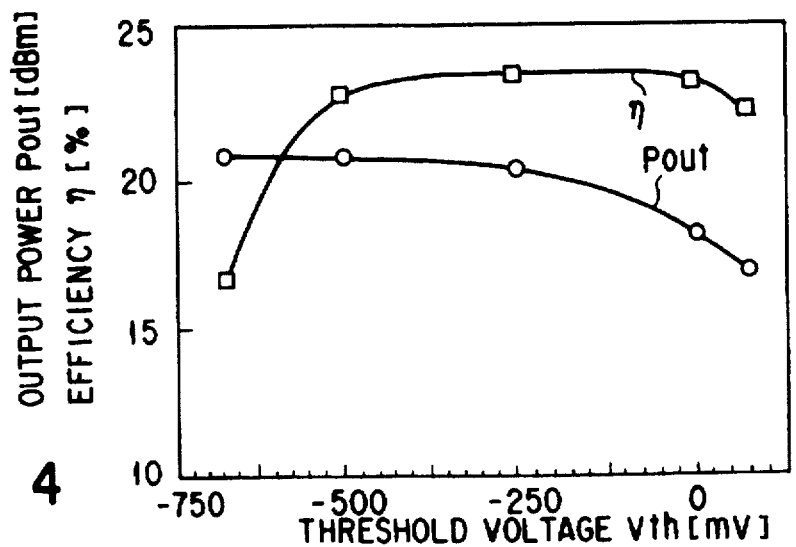
FIG. 4 is a graph illustrating the characteristics of the efficiency η and the output power Pout with respect to the threshold voltage Vth in the first embodiment.

The above-mentioned different types of MESFETs having different threshold values were used as amplifying elements and the high-frequency wave output characteristics of each element, with respect to the input of an sine wave having a frequency of 1.9 GHz was obtained. FIG. 4 is a graph illustrating the threshold voltage dependence of the high-frequency wave output characteristics of each element. Each MESFET is source-grounded, and is driven by a single power supply at a bias point where the drain bias is 2.7V and the gate bias is 0V.

FIG. 4 illustrates a characteristic curve of the output power Pout and a characteristic curve of the efficiency n. The output power Pout is substantially constant within a range of Vth<−0.5V, where the output power is decreased within a range of Vth>−0.5V as the threshold voltage Vth is increased. The efficiency η is increased within a range of Vth<−0.5V as the threshold voltage Vth increases, where it is maintained constant within a range of −0.5<Vth<0V, and it decreased within a range of Vth>0V as the threshold voltage Vth is increased. Thus, it can be concluded that the threshold voltage Vth should be set within a range of −0.5V to 0V in order to maintain a high efficiency without decreasing the output power Pout greatly.

Figure 5:
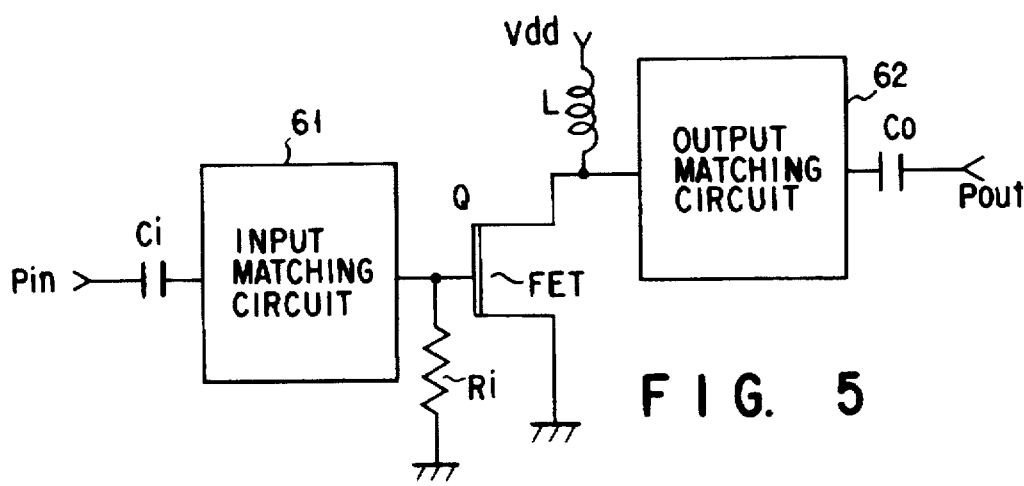
FIG. 5 is a diagram showing the circuit structure of a linear power amplifier according to the first embodiment.

FIG. 5 is a diagram showing the circuit structure of the linear power amplifier according to the first embodiment. The circuit shown in this figure is a power amplifier including an input matching circuit 61 and an output matching circuit 62, and the MESFET indicated by Q is of a source-ground type. The gate of this MESFET is grounded, and an inductor L is inserted between the drain and the power supply Vdd. The input matching circuit 61 consists of passive elements such as an inductor and a capacitor, and so does the output matching circuit 62. In the figure, Ci indicates an input capacitor, Co indicates an output capacitor and Ri indicates a stabilization resistance.

According to the first embodiment, a source-ground type MESFET is used, as an amplifying element, by a single power supply where the gate bias is set at 0V. By setting the threshold value voltage Vth of the MESFET within a range of −0.5V to 0V, a high efficiency can be achieved while maintaining a sufficient output power Pout. Further, since the device is operated by a single power supply, an increase in the number of elements such as negative voltage supply circuit, or the complexity of the circuit structure can be avoided, increasing its utility.

In the first embodiment, an asymmetrical structure in which a medium concentration layer is not formed on the drain side, is employed. However, the present invention is not limited to such a structure, but, for example, an ordinary LDD structure can be employed. Further, in this embodiment, a self-alignment structure using a refractory gate material is employed. However, the present invention is not limited to such a structure, but the invention is applicable to a MESFET having an ordinary recess structure.

(Second Embodiment)

Before describing a specific example of the second embodiment, the basic idea of the present invention practiced in the second embodiment will now be described.

The semiconductor amplifier of the present invention is of a high-frequency type which is operated at a low voltage. In this semiconductor amplifier, a source-ground type MESFET which functions as an amplifying element is provided. The MESFET is constituted such that it can be driven by a single power supply while the gate bias being set at 0V. Up to this point, the second embodiment has the same structure as that of the first one. However, in the second embodiment, a self-bias generating circuit which imparts a predetermined bias voltage between the gate and source of the MESFET, is provided so as to drive the MESFET under a single power supply. In this case, the difference between the threshold voltage of the MESFET and the bias voltage between the gate and source is set within a range of −0.7V to −0.2V. The reason why the self-bias generation circuit should preferably be provided and the difference between threshold voltage and the bias voltage between the gate and source, should preferably be set within the above range, will be made clear from the following description.

With the above-described structure, the efficiency can be increased by applying a gate bias despite of the operation by a single power supply. In the first embodiment, the efficiency η was examined while fixing the gate bias at 0V. However, different results were obtained in the examination of the relationship between the threshold voltage Vth and the efficiency η when the gate bias was consecutively changed.

Figure 6:
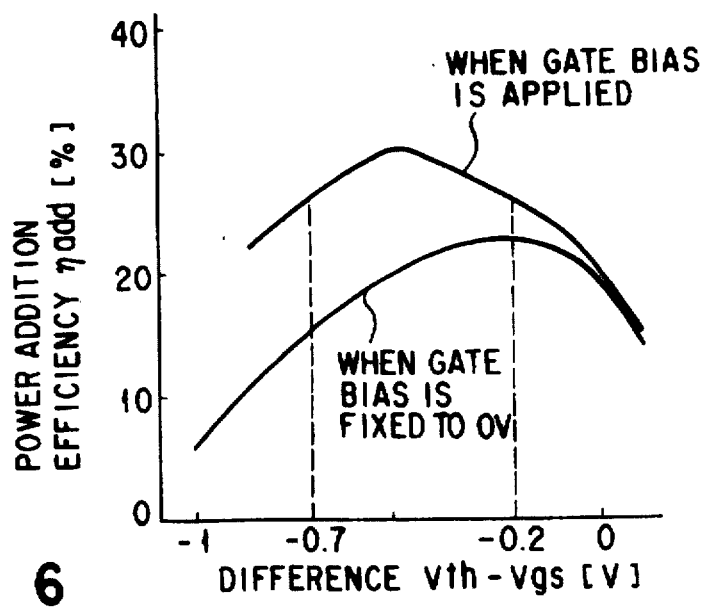
FIG. 6 is a graph designed to explain the basic idea of the present invention practiced in the second embodiment, which illustrates the relationship between a difference (Vth−

The results were standardized in a graph of (Vth−Vgs) as shown in FIG. 6. As can be seen from this figure, the efficiency is higher in the case where the bias voltage Vgs is applied than in the case where the it is not applied. More specifically, the power-added efficiency ηadd is increased in the entire region by applying a bias on the gate, and especially, in a region where the value of (Vth−Vg) is in a range of −0.7V to −0.2V, a high efficiency can be obtained. This is because different knee voltages on load curve between the case where the bias voltage Vgs is applied and the case where it is not. Consequently, in order to manufacture a power amplifier having a high efficiency, the threshold voltage Vth is set further in the negative side, and a negative bias is applied on the gate.

In order to carry out an operation by a single power supply, it suffices only if a self-bias corresponding to the above gate bias is generated. In order to achieve this, a self bias generation circuit for generating a voltage drop ΔVs, is provided between the source of the MESFET and the ground. The self bias generation circuit consists of passive elements such as a capacitor and a resistance.

The power-added efficiency ηadd varies as illustrated in the graph shown in FIG. 7, in accordance with voltage drop ΔVs in the above voltage (self bias). More specifically, as the voltage drop ΔVs becomes larger, the power-added efficiency ηadd becomes higher (region A). However, when the voltage drop ΔVs becomes excessively large, the voltage between the source and drain is decreased, causing a decrease in the power-added efficiency ηadd (region B).

In FIG. 7, the broken line A illustrates a decrease in the power-added efficiency ηadd as the gate bias becomes closer to 0V, and ΔVs=0V indicates the maximum efficiency of the case where no bias is applied to the gate. The broken line B indicates a decrease in the efficiency due to a voltage drop between the source and drain.

From the above results, it can be understood that a voltage drop ΔVs which is appropriate is in a range of 0.2 to 0.4V, with a value close to 0.3V being optimum. The voltage drop ΔVs corresponds to the bias voltage Vgs between the source and gate of the FET, and therefore a negative bias is applied to the gate in practice. That is, when ΔVs=0.3V, Vgs=−0.3V. In this case, the threshold voltage Vth of the MESFET illustrated in FIG. 6 should fall in a range of −1.0V to −0.5V.

Next, a specific example of the semiconductor amplifier according to the second embodiment will now be described.

FIG. 8 is a diagram showing the circuit structure of a linear power amplifier according to the second embodiment of the present invention. The power amplifier includes an input matching circuit 61 and an output matching circuit 62, and the MESFET indicated by Q is of a source-ground type. An example of the element structure of the MESFET is shown in the aforementioned FIG. 3. A resistance Rs (impedance element) which imparts a self-bias ΔVs is inserted between the source of the MESFET and a ground, and an inductor L is inserted between the drain and the power supply Vdd.

The input matching circuit 61 consists of passive elements such as an inductor and a capacitor, and so does the output matching circuit 62. In the figure, Ci indicates an input capacitor, Co indicates an output capacitor, Ri indicates a stabilization resistance, and Cs indicates a bypass capacitor.

With the above-described structure, when the power voltage Vdd is 3V or less, the voltage between the source and drain of the MESFET is decreased when the self bias ΔVs is increased, as described above. As a result, it is rendered impossible to obtain a desired output power Pout. Therefore, in the second embodiment, the self-bias ΔVs is set at 0.3V. In this case, the bias voltage Vgs between the gate and source is −0.3V.

FIG. 9 is a graph showing the relationship between the threshold voltage Vth of the MESFET and the efficiency η in the case where Vdd=3V and ΔVs=0.3V. The optimal range of the threshold voltage Vth of the MESFET is between −1V and −0.5V, and especially, when Vth=−0.8V, the efficiency η has a peak. Further, in the above range, an efficiency of 30% or higher can be achieved.

As described above, in the second embodiment, an efficiency higher than that of the first embodiment can be obtained by use of a self-bias circuit. The second embodiment involves a structure slightly more complicated than that of the first embodiment because of the necessity of the self bias generation circuit; however, the second embodiment, which is operated by a single power supply, is far more simple than that of the device operated by a double power supply.

As described above, the present invention is directed to the source-ground type MESFET operated by a single power supply in which the gate bias is set at 0V. When this MESFET is operated, the threshold voltage should be optimized. Thus, a semiconductor amplifier exhibiting a high efficiency can be realized while maintaining a sufficient output power.

Furthermore, according to the present invention, with the optimization of the threshold value of the source-ground type MESFET, and the employment of the self bias circuit, a semiconductor amplifier having even a higher efficiency can be realized while maintaining a sufficient output power by a single power supply.

Additional advantages and modifications will readily occur to those skilled in the art. Therefore, the present invention in its broader aspects is not limited to the specific details, representative devices, and illustrated examples shown and described herein. Accordingly, various modifications may be made without departing from the spirit or scope of the general inventive concept as defined by the appended claims and their equivalents. For example, in each of the above embodiments, the GaAs MESFET is used as a power amplifier; however the present invention is also applicable to the case where the MESFET is used as a voltage amplifier. Further, the element structure of the GaAs MESFET is not limited to that shown in FIG. 1, and can be remodeled in various ways in accordance with the usage. Furthermore, the present invention can be applied not only to a GaAs MESFET, but also to MESFETs employing semiconductors of other compounds.

What is claimed is:

1. A semiconductor amplifier comprising:
   a metal-semiconductor field-effect transistor (MESFET) of a source-ground type;
   a circuit for driving said MESFET by a single power supply; and
   a self-bias generating circuit for generating a bias voltage between a gate and a source of said MESFET by utilizing a voltage drop, which occurs between the source of said MESFET and a ground, a difference between a threshold voltage of said MESFET and said bias voltage being a predetermined value in a range of −0.7V to −0.2V.

2. A semiconductor amplifier according to claim 1, wherein the threshold voltage of said MESFET is a predetermined value within a range of −1V to −0.5V.

3. A semiconductor amplifier according to claim 1 wherein said self-bias generation circuit generates a bias voltage having a predetermined value within a range of 0.2V to 0.4V.

4. A semiconductor amplifier according to claim 1, wherein said MESFET includes a compound semiconductor, GaAs.

5. A semiconductor amplifier according to claim 1, wherein said self-bias generation circuit includes a passive element inserted between the source of said MESFET and the ground.

* * * * *